(12) United States Patent
Danno et al.

(10) Patent No.: US 12,426,318 B2
(45) Date of Patent: Sep. 23, 2025

(54) SEMICONDUCTOR DEVICE AND METHOD OF MANUFACTURING SEMICONDUCTOR DEVICE

(71) Applicant: TOYOTA JIDOSHA KABUSHIKI KAISHA, Toyota (JP)

(72) Inventors: Katsunori Danno, Obu (JP); Tetsuya Shoji, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 618 days.

(21) Appl. No.: 17/854,142

(22) Filed: Jun. 30, 2022

(65) Prior Publication Data

US 2023/0014283 A1   Jan. 19, 2023

(30) Foreign Application Priority Data

Jul. 9, 2021 (JP) .................................. 2021-114231
Jan. 31, 2022 (JP) .................................. 2022-013261

(51) Int. Cl.
| | |
|---|---|
| *H10D 62/10* | (2025.01) |
| *H01L 21/383* | (2006.01) |
| *H01L 21/425* | (2006.01) |
| *H10D 62/80* | (2025.01) |
| *H10D 8/60* | (2025.01) |

(52) U.S. Cl.
CPC ......... *H10D 62/102* (2025.01); *H01L 21/383* (2013.01); *H01L 21/425* (2013.01); *H10D 62/80* (2025.01); *H10D 8/60* (2025.01)

(58) Field of Classification Search
CPC ........ H10D 62/102; H10D 62/80; H10D 8/60; H10D 62/106; H10D 62/105; H10D 99/00; H01L 21/383; H01L 21/425
See application file for complete search history.

(56) References Cited

U.S. PATENT DOCUMENTS

2016/0042949 A1*  2/2016  Sasaki .................... H10D 99/00
                                                               257/617
2016/0104614 A1*  4/2016  Hasegawa ......... H01L 21/02271
                                                               257/77

(Continued)

FOREIGN PATENT DOCUMENTS

| JP | 2016-39194 A | 3/2016 |
| JP | 2016-081981 A | 5/2016 |

(Continued)

*Primary Examiner* — S M Sohel Imtiaz
(74) *Attorney, Agent, or Firm* — Sughrue Mion, PLLC

(57) ABSTRACT

The present disclosure relates to a semiconductor device including an n-type gallium oxide semiconductor layer that has a center region and a peripheral region having a lower donor density than the center region, an electrode layer that is laminated on the n-type gallium oxide semiconductor layer, and forms Schottky junction with the n-type gallium oxide semiconductor layer in the center region as viewed from a lamination direction, and a first p-type nickel oxide semiconductor layer that is laminated on the n-type gallium oxide semiconductor layer such that the first p-type nickel oxide semiconductor layer is partially positioned between the n-type gallium oxide semiconductor layer and the electrode layer, and has an outer peripheral end portion on a peripheral region side in the peripheral region as viewed from the lamination direction.

14 Claims, 7 Drawing Sheets

(56) References Cited

U.S. PATENT DOCUMENTS

| | | | | |
|---|---|---|---|---|
| 2016/0336408 A1* | 11/2016 | de Souza | ............ | H10D 30/798 |
| 2018/0240864 A1* | 8/2018 | Nagaoka | ................ | H10D 99/00 |
| 2018/0240914 A1* | 8/2018 | Nagaoka | ........... | H01L 21/02271 |
| 2019/0067426 A1* | 2/2019 | Sugimoto | ......... | H01L 21/02502 |
| 2020/0168711 A1* | 5/2020 | Sasaki | .................. | H10D 62/402 |
| 2021/0234009 A1* | 7/2021 | Yuda | ...................... | H10D 30/83 |
| 2022/0216304 A1* | 7/2022 | Lu | ........................ | H10D 30/475 |

FOREIGN PATENT DOCUMENTS

| | | |
|---|---|---|
| JP | 2018-137393 A | 8/2018 |
| JP | 2018-137394 A | 8/2018 |
| JP | 2019-36593 A | 3/2019 |
| JP | 2019-041107 A | 3/2019 |
| WO | 2020/039971 A1 | 2/2020 |

* cited by examiner

SEMICONDUCTOR DEVICE AND METHOD OF MANUFACTURING SEMICONDUCTOR DEVICE

CROSS-REFERENCE TO RELATED APPLICATION

This application claims priority to Japanese Patent Application No. 2021-114231 filed on Jul. 9, 2021 and Japanese Patent Application No. 2022-013261 filed on Jan. 31, 2022, each incorporated herein by reference in its entirety.

BACKGROUND

1. Technical Field

The present disclosure relates to a semiconductor device and a method of manufacturing a semiconductor device.

2. Description of Related Art

Japanese Unexamined Patent Application Publication No. 2016-81981 (JP 2016-81981 A) discloses a semiconductor device formed of semiconductor Sic, having a termination region around an active region, and having a surface of the termination region covered with a passivation film, in which the passivation film includes a first silicon oxide film in contact with the surface of the termination region, a second silicon oxide film laminated on the first silicon oxide film and in contact with the first silicon oxide film, and a third silicon oxide film laminated on the second silicon oxide film and in contact with the second silicon oxide film. JP 2016-81981 A discloses that the semiconductor device may have a field limiting ring (FLR) structure in the termination region.

SUMMARY

In a semiconductor device in which an n-type gallium oxide semiconductor layer and an electrode layer form Schottky junction, a p-type nickel oxide semiconductor layer can be adopted as a peripheral withstand voltage structure. However, it is difficult to reduce an acceptor density of the p-type nickel oxide semiconductor layer. Therefore, an electric field is concentrated on an outer peripheral end portion of the p-type nickel oxide semiconductor layer in contact with the electrode layer, and dielectric breakdown is likely to occur.

Therefore, in the semiconductor device in which the n-type gallium oxide semiconductor layer and the electrode layer form the Schottky junction, it is needed to suppress the dielectric breakdown, that is, to improve a withstand voltage property.

The present disclosure is to provide a semiconductor device having a high withstand voltage property, in which an n-type gallium oxide semiconductor layer and an electrode layer form Schottky junction.

The present inventors have found that the above problems can be achieved by the following means:

Aspect 1

A first aspect of the present disclosure relates to a semiconductor device. The semiconductor device includes an n-type gallium oxide semiconductor layer that has a center region and a peripheral region having a lower donor density than the center region. The semiconductor device includes an electrode layer that is laminated on the n-type gallium oxide semiconductor layer, and forms Schottky junction with the n-type gallium oxide semiconductor layer in the center region as viewed from a lamination direction. The semiconductor device includes a first p-type nickel oxide semiconductor layer that is laminated on the n-type gallium oxide semiconductor layer such that the first p-type nickel oxide semiconductor layer is partially positioned between the n-type gallium oxide semiconductor layer and the electrode layer, and has an outer peripheral end portion on a peripheral region side in the peripheral region as viewed from the lamination direction.

Aspect 2

In the semiconductor device according to aspect 1, the donor density in the peripheral region may be $5.0 \times 10^{15}$ cm$^{-3}$ or lower.

Aspect 3

In the semiconductor device according to aspect 1 or 2, the donor density in the center region may be $1.0 \times 10^{16}$ cm$^{-3}$ or higher.

Aspect 4

In the semiconductor device according to any one of aspects 1 to 3, the first p-type nickel oxide semiconductor layer may be positioned to straddle the center region and the peripheral region as viewed from the lamination direction.

Aspect 5

In the semiconductor device according to aspect 4, in a case where a thickness of the center region of the n-type gallium oxide semiconductor layer is denoted by t and a width of a portion of the first p-type nickel oxide semiconductor layer in the center region is denoted by x, $x/t > 0.50$ may be set.

Aspect 6

In the semiconductor device according to any one of aspects 1 to 5, a donor may be Sn or Si.

Aspect 7

In the semiconductor device according to any one of aspects 1 to 6, the peripheral region may have a lower donor density than the center region due to being doped with an acceptor.

Aspect 8

In the semiconductor device according to aspect 7, the acceptor may be N or Mg.

Aspect 9

The semiconductor device according to any one of aspects 1 to 8 may further include a plurality of second p-type nickel oxide semiconductor layers that are provided in the peripheral region of the n-type gallium oxide semiconductor layer on a side on which the first p-type nickel oxide semiconductor layer is laminated, such that the second p-type nickel oxide semiconductor layers have intervals in a direction from the center region toward the peripheral region.

Aspect 10

In the semiconductor device according to aspect 9, the n-type gallium oxide semiconductor layer may have a plurality of trench structures on a side on which the first p-type nickel oxide semiconductor layer and the second p-type nickel oxide semiconductor layers are laminated; and each of the first p-type nickel oxide semiconductor layer and the second p-type nickel oxide semiconductor layers may be laminated in a recess portion of the trench structure.

Aspect 11

In the semiconductor device according to any one of aspects 1 to 10, the semiconductor device may be a pn diode, a JBS diode, a metal oxide semiconductor field effect transistor, or a junction field effect transistor.

Aspect 12

A second aspect of the present disclosure relates to a method of manufacturing the semiconductor device according to any one of aspects 1 to 11. The method includes reducing the donor density by ion irradiation or heating in an oxygen atmosphere to form the peripheral region of the n-type gallium oxide semiconductor layer.

Aspect 13

In the method according to aspect 12, in the ion irradiation, irradiation is performed with an ion of an acceptor element, hydrogen, or helium may be performed.

Aspect 14

In the method according to aspect 12 or 13, the n-type gallium oxide semiconductor layer may be subjected to annealing treatment after the ion irradiation.

Aspect 15

In the method according to aspect 12 or 13, the n-type gallium oxide semiconductor layer may be not subjected to annealing treatment after the ion irradiation.

According to the present disclosure, it is possible to provide the semiconductor device having a high withstand voltage property, in which the n-type gallium oxide semiconductor layer and the electrode layer form the Schottky junction.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

In the following, an embodiment of the present disclosure will be described in detail. It should be noted that the present disclosure is not limited to the following embodiment, and can be variously modified and implemented within the scope of the spirit of the disclosure.

The present disclosure relates to a semiconductor device including an n-type gallium oxide semiconductor layer that has a center region and a peripheral region having a lower donor density than the center region, an electrode layer that is laminated on the n-type gallium oxide semiconductor layer, and forms Schottky junction with the n-type gallium oxide semiconductor layer in the center region as viewed from a lamination direction, and a first p-type nickel oxide semiconductor layer that is laminated on the n-type gallium oxide semiconductor layer such that the first p-type nickel oxide semiconductor layer is partially positioned between the n-type gallium oxide semiconductor layer and the electrode layer, and has an outer peripheral end portion on a peripheral region side in the peripheral region as viewed from the lamination direction.

In the semiconductor device in which the n-type gallium oxide semiconductor layer and the electrode layer form the Schottky junction, in a case where the p-type nickel oxide semiconductor layer is adopted as a peripheral withstand voltage structure, dielectric breakdown is likely to occur. This is because it is difficult to reduce an acceptor density of the p-type nickel oxide semiconductor layer, so that an electric field tends to concentrate on the outer peripheral end portion of the p-type nickel oxide semiconductor layer in contact with the electrode layer.

In the semiconductor device of the present disclosure, the outer peripheral end portion of the first p-type nickel oxide semiconductor layer on the peripheral region side is present in the peripheral region of the n-type gallium oxide semiconductor layer as viewed from the lamination direction. The peripheral region has a lower donor density than the center region. As a result, the concentration of the electric field on the outer peripheral end portion of the first p-type nickel oxide semiconductor layer in contact with the electrode layer is suppressed. Therefore, in the semiconductor device of the present disclosure, the dielectric breakdown is suppressed.

Figure 1:
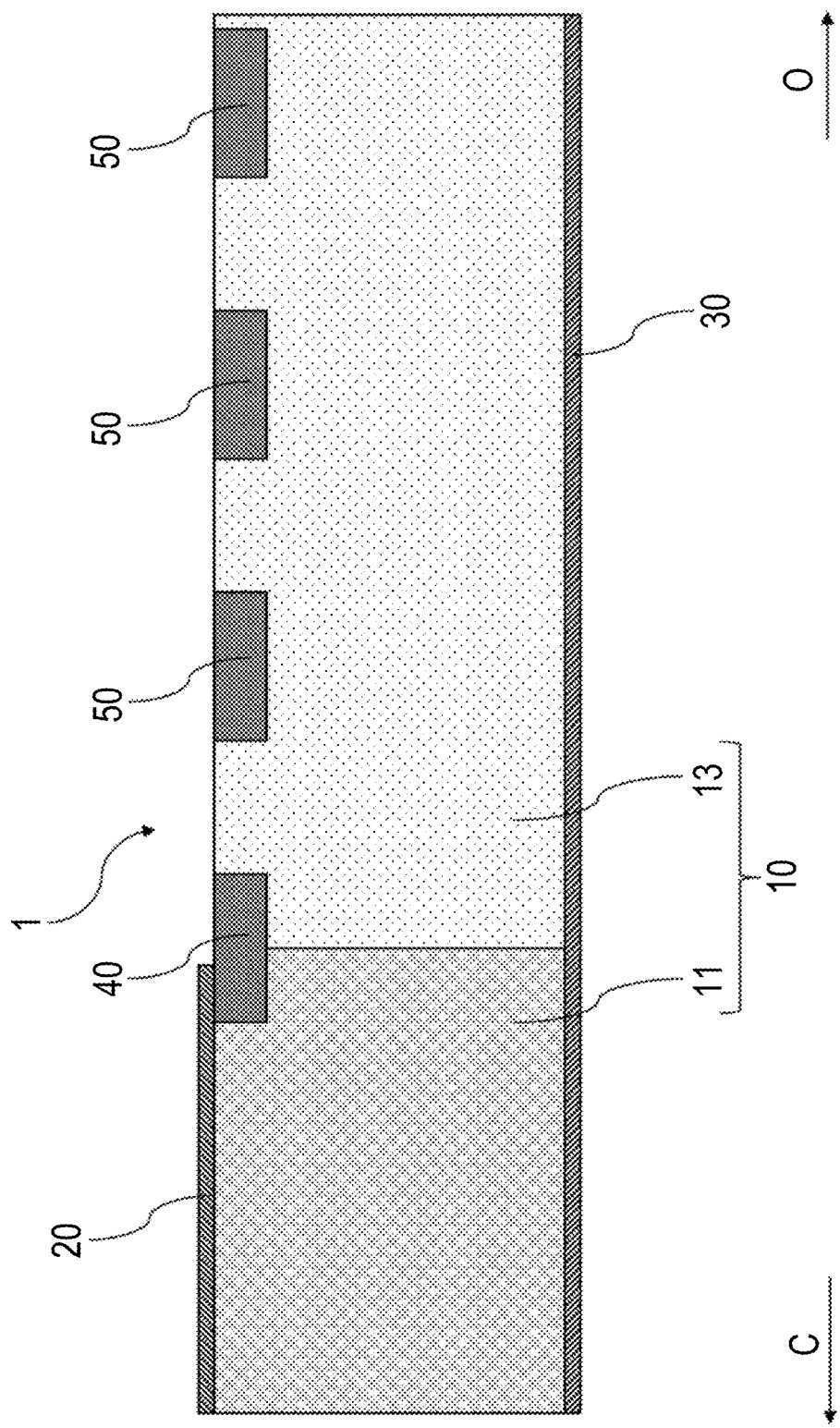
FIG. 1 is a schematic diagram of a semiconductor device 1 according to a first embodiment of the present disclosure.

FIG. 1 is a schematic diagram of a semiconductor device 1 according to a first embodiment of the present disclosure.

As shown in FIG. 1, the semiconductor device 1 according to the first embodiment of the present disclosure includes an n-type gallium oxide semiconductor layer 10 that has a center region 11 and a peripheral region 13 having a lower donor density than the center region 11, a first electrode layer 20 that is laminated on the n-type gallium oxide semiconductor layer 10, and forms Schottky junction with the n-type gallium oxide semiconductor layer 10 in the center region 11 as viewed from a lamination direction, and a first p-type nickel oxide semiconductor layer 40 that is laminated on the n-type gallium oxide semiconductor layer 10 such that the first p-type nickel oxide semiconductor layer 40 is partially positioned between the n-type gallium oxide semiconductor layer 10 and the first electrode layer 20, and has an outer peripheral end portion on a peripheral region 13 side in the peripheral region 13 as viewed from the lamination direction.

In addition, in the semiconductor device 1 according to the first embodiment of the present disclosure, a second electrode layer 30 is laminated on a surface among surfaces of the n-type gallium oxide semiconductor layer 10 on a side on which the first electrode layer 20 is not laminated. It should be noted that the second electrode layer 30 forms Ohmic junction with the n-type gallium oxide semiconductor layer 10.

It should be noted that, in FIG. 1, "C" indicates a center region side, and "O" indicates a peripheral region side. It should be noted that the "center region side C" and the "peripheral region side O" merely indicate the directions, and the "center region side C" of a certain component does not always overlap with the center region of the n-type gallium oxide semiconductor layer 10 as viewed from the lamination direction. The same applies to the "peripheral region side O".

In the semiconductor device 1 according to the first embodiment of the present disclosure, the outer peripheral end portion of the first p-type nickel oxide semiconductor layer 40 on the peripheral region side O is present in the peripheral region 13 of the n-type gallium oxide semiconductor layer 10 as viewed from the lamination direction. Here, the peripheral region 13 has a lower donor density than the center region 11. As a result, the concentration of the electric field on the outer peripheral end portion of the first p-type nickel oxide semiconductor layer 40 in contact with the first electrode layer 20 is suppressed. Therefore, in the semiconductor device 1 according to the first embodiment of the present disclosure, the dielectric breakdown is suppressed.

It should be noted that FIG. 1 is not intended to limit the semiconductor device of the present disclosure.

Figure 2:
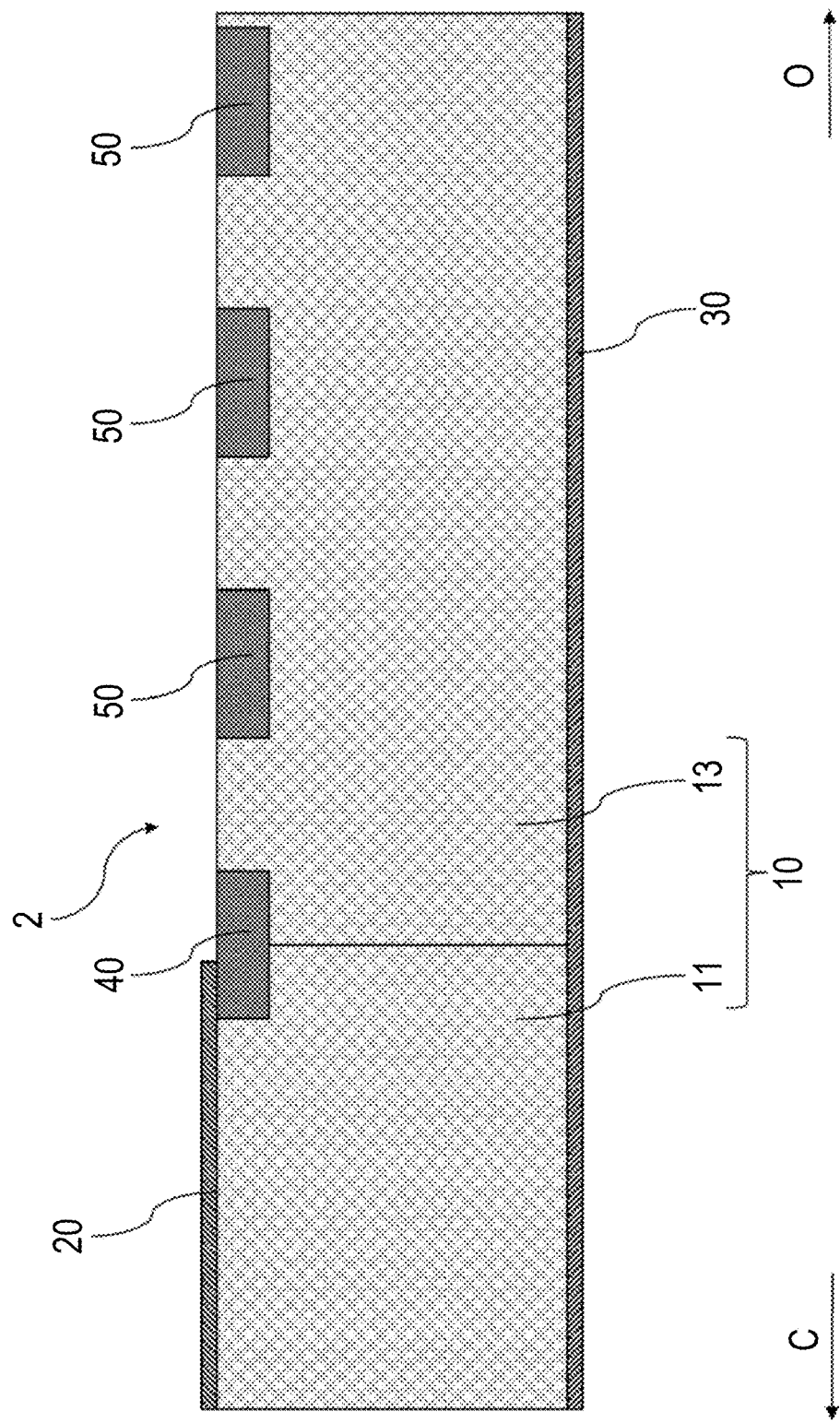
FIG. 2 is a schematic diagram of a semiconductor device 2 different from the embodiment of the present disclosure.

FIG. 2 is a schematic diagram of a semiconductor device 2 different from the embodiment of the present disclosure.

As shown in FIG. 2, in the semiconductor device 2 different from the embodiment of the present disclosure, there is no difference in the donor density between the center region 11 and the peripheral region 13. In general, the p-type nickel oxide semiconductor layer has a high acceptor density. Therefore, in such a semiconductor device 2, the electric field is concentrated on the outer peripheral end portion of the first p-type nickel oxide semiconductor layer 40 in contact with the first electrode layer 20, so that the dielectric breakdown is likely to occur.

It should be noted that the semiconductor device of the present disclosure may be, for example, a diode, more specifically a pn diode, a JBS diode, or a transistor, and still more specifically a metal oxide semiconductor field effect transistor (MOSFET) or a junction field effect transistor (JFET).

n-Type Gallium Oxide Semiconductor Layer

The n-type gallium oxide semiconductor layer has the center region and the peripheral region. The donor density in the peripheral region is lower than the donor density in the center region.

The n-type gallium oxide semiconductor layer may be formed on, for example, a gallium oxide single crystal layer. More specifically, the n-type gallium oxide semiconductor layer may be, for example, an epitaxial layer.

The gallium oxide single crystal layer can be, for example, a layer of an $\alpha$-$Ga_2O_3$ single crystal, a $\beta$-$Ga_2O_3$ single crystal, or a $Ga_2O_3$ single crystal having another crystal structure, and is preferably the layer of the $\beta$-$Ga_2O_3$ single crystal.

The n-type gallium oxide semiconductor layer contains a donor. The donor can be, for example, Sn or Si.

Center Region

The center region can include at least an active region of a Schottky diode in which the electrode layer is disposed. It should be noted that the active region is a portion that forms a semiconductor element.

The center region has a higher donor density than the peripheral region.

The donor density in the center region can be $1.0 \times 10^{16}$ $cm^{-3}$ or higher.

The donor density in the center region may be $1.0 \times 10^{16}$ $cm^{-3}$ or higher and $1.0 \times 10^{18}$ $cm^{-3}$ or lower.

The donor density in the center region may be $1.0 \times 10^{16}$ $cm^{-3}$ or higher, $2.0 \times 10^{16}$ $cm^{-3}$ or higher, $5.0 \times 10^{16}$ $cm^{-3}$ or higher, or $1.0 \times 10^{17}$ $cm^{-3}$ or higher, and may be $1.0 \times 10^{18}$ $cm^{-3}$ or lower, $5.0 \times 10^{17}$ $cm^{-3}$ or lower, $2.0 \times 10^{17}$ $cm^{-3}$ or lower, or $1.0 \times 10^{17}$ $cm^{-3}$ or lower.

Peripheral Region

The peripheral region is a region surrounding a periphery of the center region. The peripheral region has a lower donor density than the center region.

The donor density in the peripheral region may be $5.0 \times 10^{15}$ $cm^{-3}$ or lower.

The donor density in the peripheral region may be 0.0 $cm^{-3}$ or higher and $5.0 \times 10^{15}$ $cm^{-3}$ or lower.

The donor density in the peripheral region may be 0.0 $cm^{-3}$ or higher, $5.0 \times 10^{10}$ $cm^{-3}$ or higher, $2.0 \times 10^{14}$ $cm^{-3}$ or higher, or $1.0 \times 10^{15}$ $cm^{-3}$ or higher, and may be $5.0 \times 10^{15}$ $cm^{-3}$ or lower, or $1.0 \times 10^{15}$ $cm^{-3}$ or lower.

An acceptor can be doped in the peripheral region to make the donor density in the peripheral region lower than in the center region. In this case, for example, by forming the n-type gallium oxide semiconductor layer uniformly doped with the donor, and then doping the acceptor into a portion of the n-type gallium oxide semiconductor layer that should be the peripheral region, the center region and the peripheral region can be easily formed.

Doping of the acceptor into the n-type gallium oxide semiconductor layer may be performed, for example, by ion implantation before the first p-type nickel oxide semiconductor layer or the first and second p-type nickel oxide semiconductor layers are laminated on the n-type gallium oxide semiconductor layer.

The acceptor may be, for example, N or Mg.

Electrode Layer

The electrode layer is laminated on the n-type gallium oxide semiconductor layer. The electrode layer forms the Schottky junction with the n-type gallium oxide semiconductor layer in the center region as the semiconductor device is viewed from the lamination direction.

The electrode layer can be formed of any material capable of forming the Schottky junction with the n-type gallium oxide semiconductor layer, at least in a portion in contact with the n-type gallium oxide semiconductor layer.

Examples of the material capable of forming the Schottky junction with the n-type gallium oxide semiconductor layer include Ti, Ni, Fe, Cu, Mo, W, and Pt, but are not limited thereto.

The electrode layer may be formed on the n-type gallium oxide semiconductor layer by, for example, any film formation method. The film formation method of forming the electrode layer may be, for example, a physical vapor deposition method, more specifically, vacuum deposition, molecular beam deposition, ion plating, ion beam deposition, conventional sputtering, magnetron sputtering, or ion beam sputtering.

It should be noted that the semiconductor device of the present disclosure can have an $n^+$-type gallium oxide substrate and another electrode layer on the surface of the n-type gallium oxide semiconductor layer on an opposite side to the side on which the electrode layer is laminated. In the following, the $n^+$-type gallium oxide substrate will be omitted for the sake of simplicity.

The other electrode layer can form the Ohmic junction with the n-type gallium oxide semiconductor layer at least in the portion in contact with the n-type gallium oxide semiconductor layer.

The other electrode layer can be formed of any material capable of forming the Ohmic junction with the n-type gallium oxide semiconductor layer, at least in the portion in contact with the n-type gallium oxide semiconductor layer.

Examples of the material capable of forming the Ohmic junction with the n-type gallium oxide semiconductor layer include Ti, but are not limited thereto.

It should be noted that the other electrode layer can also be formed by the same method as the electrode layer.

First p-Type Nickel Oxide Semiconductor Layer

The semiconductor device of the present disclosure includes the first p-type nickel oxide semiconductor layer laminated on the n-type gallium oxide semiconductor layer such that the first p-type nickel oxide semiconductor layer is partially positioned between the n-type gallium oxide semiconductor layer and the electrode layer. In the first p-type nickel oxide semiconductor layer, the outer peripheral end portion on the peripheral region side is present in the peripheral region as the semiconductor device is viewed from the lamination direction.

The first p-type nickel oxide semiconductor layer can be doped with the acceptor.

The acceptor may be, for example, Li, Cu, or Ag.

The acceptor density in the first p-type nickel oxide semiconductor layer can be $1.0\times10^{18}$ cm$^{-3}$ or higher.

The acceptor density in the first p-type nickel oxide semiconductor layer may be $1.0\times10^{18}$ cm$^{-3}$ or higher and $1.0\times10^{20}$ cm$^{-3}$ or lower.

The acceptor density in the first p-type nickel oxide semiconductor layer may be $1.0\times10^{18}$ cm$^{-3}$ or higher, $2.0\times10^{18}$ cm$^{-3}$ or higher, $5.0\times10^{18}$ cm$^{-3}$ or higher, or $1.0\times10^{19}$ cm$^{-3}$ or higher, and may be $1.0\times10^{20}$ cm$^{-3}$ or lower, $5.0\times10^{19}$ cm$^{-3}$ or lower, $2.0\times10^{19}$ cm$^{-3}$ or lower, or $1.0\times10^{19}$ cm$^{-3}$ or lower.

It should be noted that the doping of the acceptor into the first p-type nickel oxide semiconductor layer can be performed, for example, by doping at the time of film formation.

As viewed from the lamination direction, the first p-type nickel oxide semiconductor layer can be positioned to straddle the center region and the peripheral region. As a result, as the semiconductor device is viewed from the lamination direction, a portion in the center region and a portion in the peripheral region of the first p-type nickel oxide semiconductor layer are formed.

Figure 3:
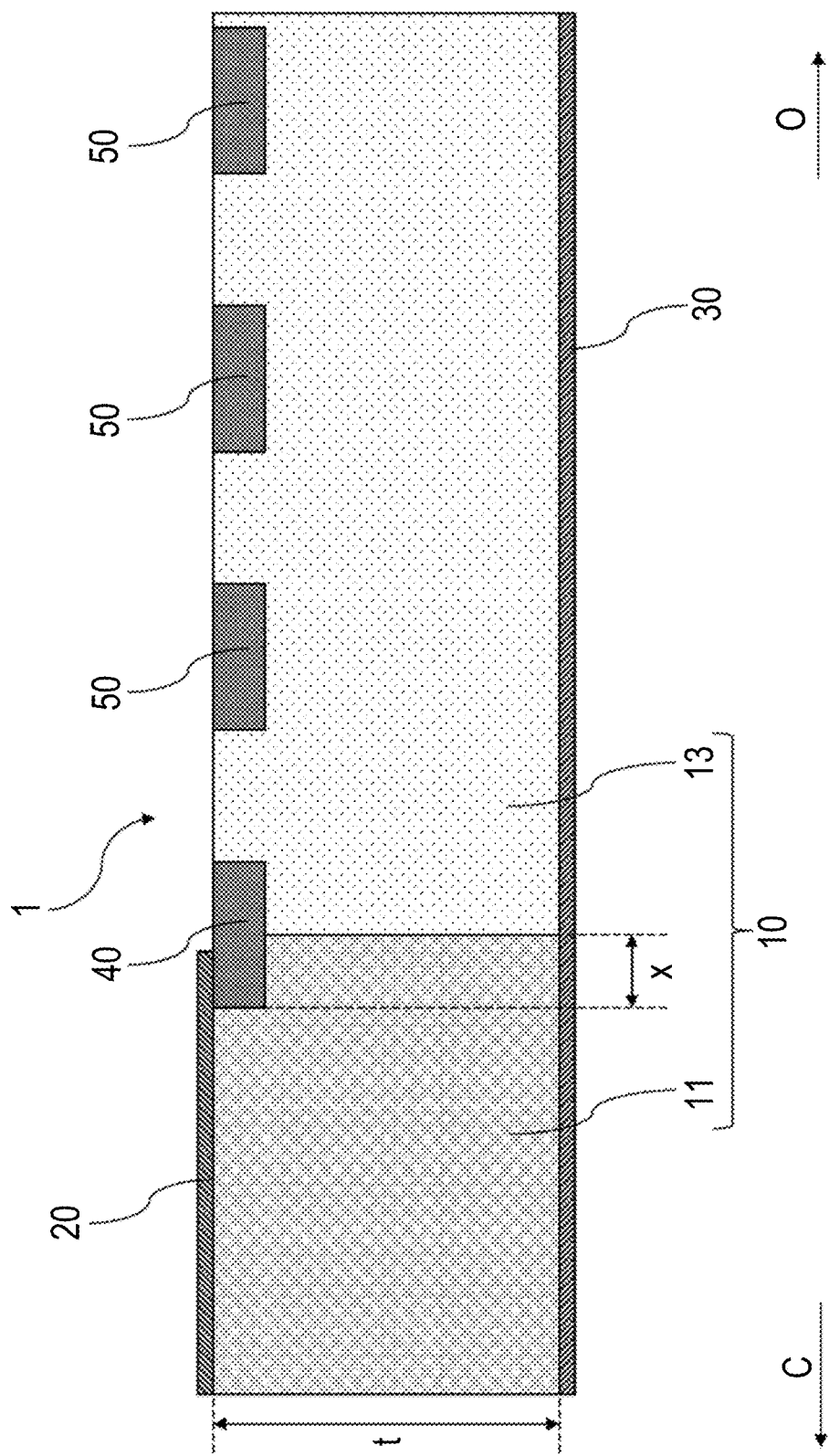
FIG. 3 is a schematic diagram of the semiconductor device 1 according to the first embodiment of the present disclosure.

Here, as shown in FIG. 3, in the semiconductor device 1 of the present disclosure, in a case where a thickness of a drift layer of the center region 11 of the n-type gallium oxide semiconductor layer 10 is denoted by t (excluding the n$^+$-type gallium oxide semiconductor substrate) and a width of a portion of the first p-type nickel oxide semiconductor layer 40 in the center region 11 is denoted by x, it is preferable that x/t>0.50. It should be noted that the "thickness" means the maximum thickness of the drift layer. In addition, the "width" means the maximum width.

It should be noted that FIG. 3 is not intended to limit the semiconductor device of the present disclosure.

In a case where the portion of the first p-type nickel oxide semiconductor layer in the center region is small, that is, in a case where x/t is small, the withstand voltage property of the semiconductor device can be improved, on the other hand, the resistivity of the semiconductor device is increased.

In a case where x/t>0.50, the resistivity of the semiconductor device can be maintained, and the withstand voltage property can be improved.

In addition, x/t≤2.00 may be set.

x/t may exceed 0.50, may be 0.80 or more, 1.00 or more, or 1.50 or more, and may be 2.00 or less, 1.80 or less, 1.60 or less, or 1.50 or less.

The width of the first p-type nickel oxide semiconductor layer may be, for example, 1.0 μm to 10.0 μm. It should be noted that the "width" means the maximum width.

The width of the first p-type nickel oxide semiconductor layer may be 1.0 μm or more, 2.0 μm or more, 3.0 μm or more, or 5.0 μm or more, and may be 10.0 μm or less, 8.0 μm or less, 60.0 μm or less, or 5.0 μm or less.

It should be noted that the first p-type nickel oxide semiconductor layer can be laminated in, for example, a recess portion of a trench structure formed on a surface among the surfaces of the n-type gallium oxide semiconductor layer on the side on which the electrode layer is laminated.

Second p-Type Nickel Oxide Semiconductor Layer

The semiconductor device of the present disclosure can include a plurality of second p-type nickel oxide semiconductor layers that are provided in the peripheral region of the n-type gallium oxide semiconductor layer on the side on which the first p-type nickel oxide semiconductor layer is laminated, such that the second p-type nickel oxide semiconductor layers have intervals in a direction from the center region toward the peripheral region. The second p-type nickel oxide semiconductor layers can function as a peripheral withstand voltage structure together with the first p-type nickel oxide semiconductor layer.

An acceptor density in the second p-type nickel oxide semiconductor layer may be the same as the acceptor density in the first p-type nickel oxide semiconductor layer.

A width of the second p-type nickel oxide semiconductor layer may be, for example, 1.0 μm to 10.0 μm. It should be noted that the "width" means the maximum width.

The width of the second p-type nickel oxide semiconductor layer may be 1.0 μm or more, 2.0 μm or more, 3.0 μm or more, or 4.0 μm or more, and may be 10.0 μm or less, 9.0 μm or less, 80.0 μm or less, or 7.0 μm or less.

The interval between the second p-type nickel oxide semiconductor layers adjacent to each other and/or between the first p-type nickel oxide semiconductor layer and the second p-type nickel oxide semiconductor layer adjacent to each other may be, for example, 0.5 μm to 5.0 μm. It should be noted that the "interval" means the shortest distance between the p-type nickel oxide semiconductor layers adjacent to each other.

The interval may be 0.5 μm or more, 1.0 μm or more, 1.5 μm or more, or 2.0 μm or more, and may be 5.0 μm or less, 4.5 μm or less, 4.0 μm or less, or 3.5 μm or less.

It should be noted that the second p-type nickel oxide semiconductor layers can be laminated in, for example, the recess portion of the trench structure formed on the surface among the surfaces of the n-type gallium oxide semiconductor layer on the side on which the electrode layer is laminated.

Trench Structure

The n-type gallium oxide semiconductor layer can have a plurality of trench structures on a side on which the first p-type nickel oxide semiconductor layer and the second p-type nickel oxide semiconductor layers are laminated. Each of the first p-type nickel oxide semiconductor layer and the second p-type nickel oxide semiconductor layers can be laminated in the recess portion of the trench structure.

The trench structure can be formed, for example, by etching the n-type gallium oxide semiconductor layer. Etching can be performed by masking a portion that is a convex portion of the trench structure on the surface of the n-type gallium oxide semiconductor layer. After etching, the masking is removed. Thereafter, the p-type nickel oxide semiconductor layer is deposited on the surface of the n-type gallium oxide semiconductor layer by, for example, the physical vapor deposition method. Finally, the p-type nickel oxide semiconductor layer laminated in the recess portion of the trench structure is left, and the p-type nickel oxide semiconductor layer laminated on the convex portion of the trench structure is removed. As a result, it is possible to form a structure in which the first and second p-type nickel oxide semiconductor layers are laminated in the recess portion of the trench structure.

Method of Manufacturing Semiconductor Device

A method of manufacturing the semiconductor device of the present disclosure includes reducing the donor density by ion irradiation or heating in an oxygen atmosphere to form the peripheral region of the n-type gallium oxide semiconductor layer.

Ion Irradiation

A method of manufacturing the semiconductor device of the present disclosure includes reducing the donor density by the ion irradiation to form the peripheral region of the n-type gallium oxide semiconductor layer.

In the method of manufacturing the semiconductor device of the present disclosure, the ion irradiation is performed on a precursor of the n-type gallium oxide semiconductor layer, for example, a gallium oxide layer having a predetermined donor density to reduce the donor density in the portion.

In the ion irradiation, irradiation may be performed with an ion of an acceptor element, hydrogen, or helium. Examples of the acceptor element include Mg, N, and Ga.

In a case where irradiation is performed with hydrogen or helium in the ion irradiation, the donor can be reduced to a deeper region of the n-type gallium oxide semiconductor layer.

After the ion irradiation, the n-type gallium oxide semiconductor layer may be subjected to annealing treatment, but it is preferable not to perform the annealing treatment from the viewpoint of improving productivity. It should be noted that the "annealing treatment" is, for example, heat treatment in an inert gas atmosphere. A temperature of the heat treatment of the "annealing treatment" is, for example, 800° C. or higher.

Heating in Oxygen Atmosphere

The method of manufacturing the semiconductor device of the present disclosure includes forming the peripheral region of the n-type gallium oxide semiconductor layer by the heating in the oxygen atmosphere.

In the method of manufacturing the semiconductor device of the present disclosure, the principle that the donor density can be reduced by the heating in the oxygen atmosphere is considered to be that a defect compensating for the donor is generated on the surface of the gallium oxide layer to reduce the donor density, but is not limited thereto.

In the method of manufacturing the semiconductor device of the present disclosure, the precursor of the n-type gallium oxide semiconductor layer, for example, the gallium oxide layer having a predetermined donor density is heated in the oxygen atmosphere to form the peripheral region of the n-type gallium oxide semiconductor layer. The center region of the n-type gallium oxide semiconductor layer has a higher donor density than the peripheral region. However, the donor density need only be reduced at the portion that should be the peripheral region by, for example, masking the surface of the portion of the precursor that should be the center region of the n-type gallium oxide semiconductor layer.

Meaning of "in the oxygen atmosphere" is an atmosphere containing oxygen, and may be, for example, an air atmosphere. The concentration of oxygen in the oxygen atmosphere is not particularly limited, but for example, a volume ratio of oxygen to an entire atmosphere can be 5.0% to 40.0%. The volume ratio of oxygen may be 5.0% or more, 10.0% or more, 15.0% or more, or 20.0% or more, and may be 40.0% or less, 35.0% or less, 30.0% or less, or 25.0% or less.

A heating temperature is not particularly limited as long as the heating temperature is high enough to reduce the donor density of the gallium oxide layer.

The heating temperature may be, for example, 600° C. to 900° C. The heating temperature may be 600° C. or higher, 650° C. or higher, 675° C. or higher, or 700° C. or higher, and may be 900° C. or lower, 850° C. or lower, 800° C. or lower, or 750° C. or lower.

It should be noted that the heating may be performed before or after the first or second p-type nickel oxide semiconductor layer is formed on the n-type gallium oxide semiconductor layer, but it is preferable to perform the heating before nickel oxide is formed in a case of a high temperature at which there is a risk of decomposition of nickel oxide.

EXAMPLES 1 TO 6 AND COMPARATIVE EXAMPLES 1 TO 3

Comparative Example 1

A Pt electrode layer was formed on the n-type gallium oxide semiconductor layer having a donor density Nd of $1.2 \times 10^{16}$ cm$^{-3}$ to obtain the Schottky diode. It should be noted that the n-type gallium oxide semiconductor layer was held on an n$^+$-type gallium oxide semiconductor substrate (thickness 650 μm), but is omitted in the figure. The obtained semiconductor device was used as a semiconductor device of Comparative Example 1. It should be noted that the thickness of the n-type gallium oxide semiconductor layer was 10 μm.

Comparative Example 2

A semiconductor device of Comparative Example 2 was manufactured in the same manner as in Comparative Example 1 except that the p-type nickel oxide semiconductor layer having an effective acceptor density Na of $1.0 \times 10^{19}$ cm$^3$ was formed in an end portion of the Schottky diode as a guard ring (GR).

Figure 4:
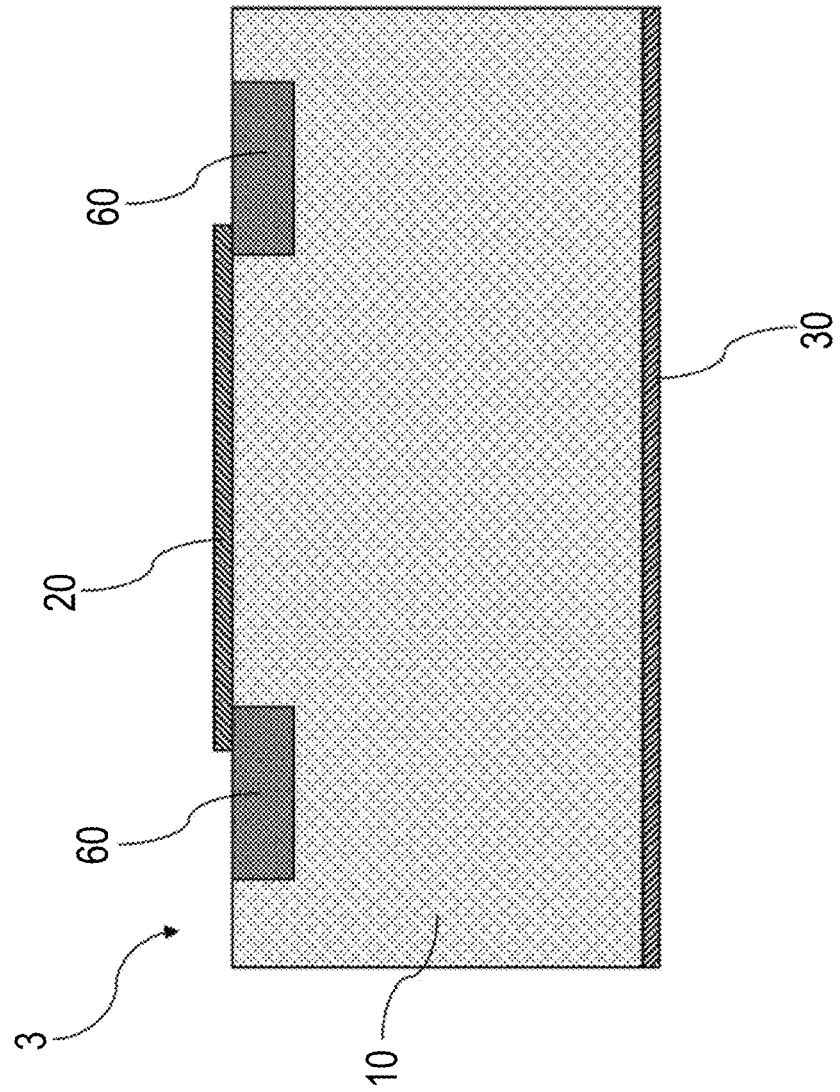
FIG. 4 is a schematic diagram of a semiconductor device 3 of Comparative Example 2.

Specifically, a semiconductor device 3 of Comparative Example 2 had a configuration as shown in FIG. 4.

As shown in FIG. 4, in the semiconductor device 3 of Comparative Example 2, the first electrode layer 20 was laminated on one surface of the n-type gallium oxide semiconductor layer 10. The first electrode layer 20 formed the Schottky junction with the n-type gallium oxide semiconductor layer 10. In addition, in the semiconductor device 3 of Comparative Example 2, the second electrode layer 30 was laminated on the other surface of the n-type gallium oxide semiconductor layer 10. The second electrode layer 30 formed the Ohmic junction with the n-type gallium oxide semiconductor layer 10.

In FIG. 4, the semiconductor device 3 of Comparative Example 2 had a guard ring 60 disposed to be partially positioned between the n-type gallium oxide semiconductor layer 10 and the first electrode layer 20. A guard ring layer was the p-type nickel oxide semiconductor layer.

Comparative Example 3

A semiconductor device of Comparative Example 3 was manufactured in the same manner as in Comparative Example 1 except that a plurality of p-type nickel oxide semiconductor layers having the effective acceptor density Na of $1.0 \times 10^{19}$ cm$^{-3}$ was formed in the end portion of the Schottky diode as the peripheral withstand voltage structure to form a field limiting ring (FLR). Here, a width of the p-type nickel oxide semiconductor layer was 2.5 μm. In addition, a distance between the p-type nickel oxide semiconductor layers adjacent to each other was 5.0 μm.

Figure 5:
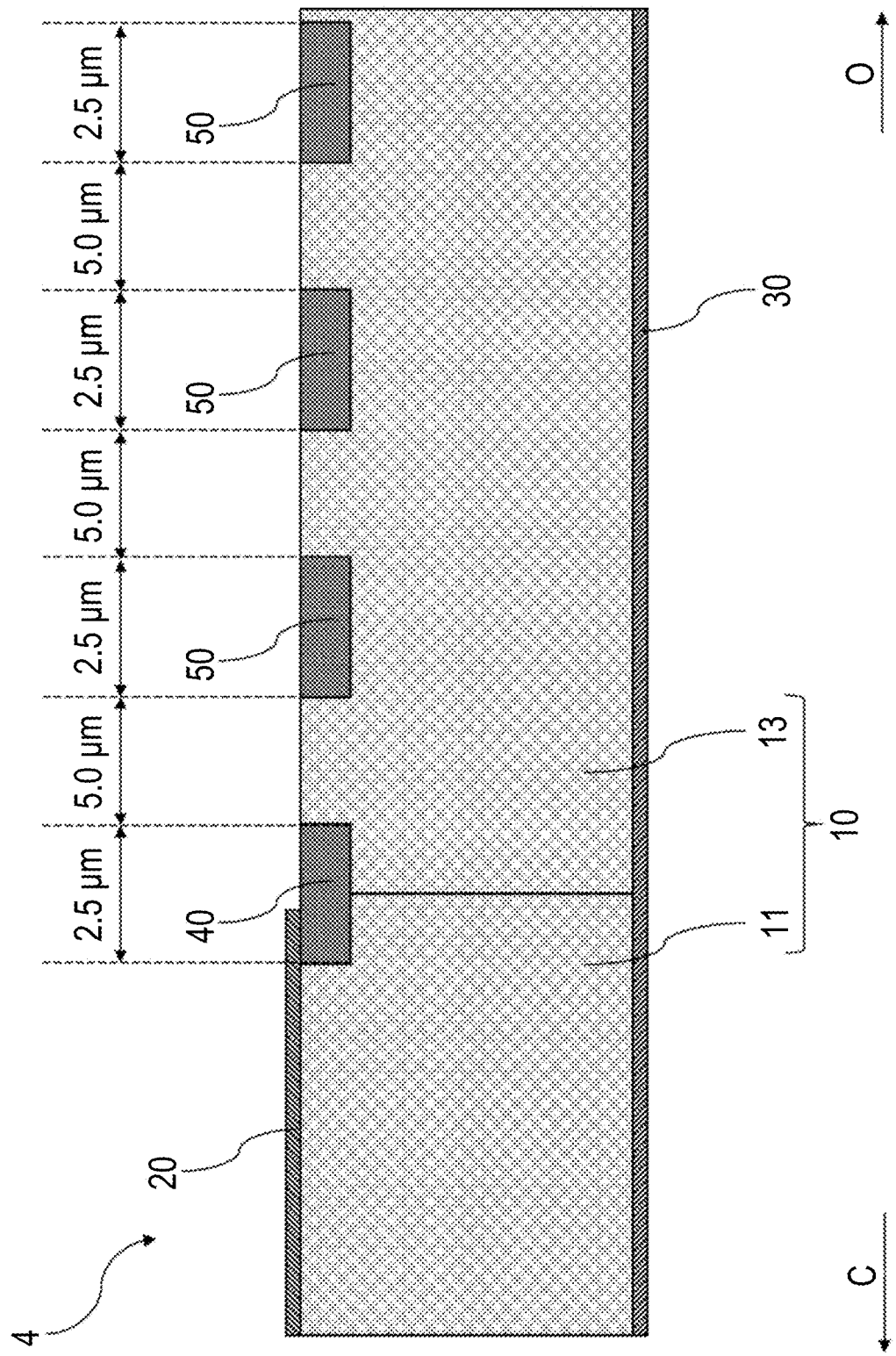
FIG. 5 is a schematic diagram of a semiconductor device 4 of Comparative Example 3.

Specifically, a semiconductor device 4 of Comparative Example 3 had a configuration as shown in FIG. 5.

Example 1

A semiconductor device of Example 1 was manufactured in the same manner as in Comparative Example 3 except that the donor density Nd in the peripheral region of the n-type gallium oxide semiconductor layer was reduced. As a result, the donor density Nd in the portion of the n-type gallium oxide semiconductor layer surrounding the outer peripheral end portion of the p-type nickel oxide semiconductor layer on the peripheral region side interposed between the electrode layer and the n-type gallium oxide semiconductor layer was lower than the donor density Nd in the portion of the n-type gallium oxide semiconductor layer surrounding the other portion of the p-type nickel oxide semiconductor layer.

It should be noted that, in the semiconductor device of Example 1, the donor density in the center region was $1.2 \times 10^{16}$ cm$^{-3}$, and the effective donor density in the peripheral region was 0.0 cm$^{-3}$.

Figure 6:
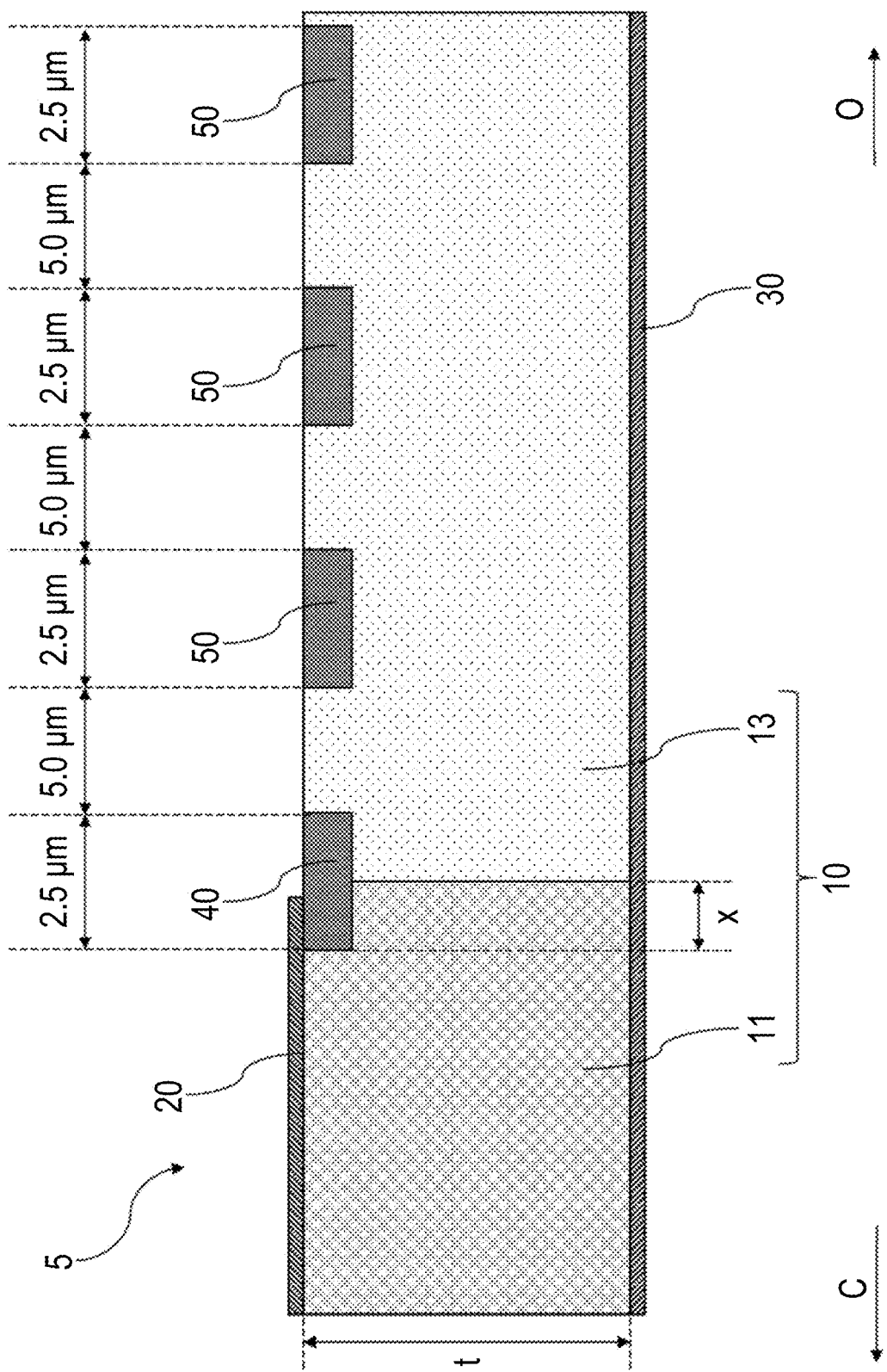
FIG. 6 is a schematic diagram of a semiconductor device 5 of Example 1.

A semiconductor device 5 of Example 1 had a configuration as shown in FIG. 6. Here, in the semiconductor device 5 of Example 1, the ratio x/t of the width x of the portion of the p-type nickel oxide semiconductor layer interposed between the electrode layer and the n-type gallium oxide semiconductor layer in the center region to the thickness t of the n-type gallium oxide semiconductor layer 10 was 1.50.

Example 2

A semiconductor device of Example 2 was manufactured in the same manner as in Example 1 except that the donor density in the peripheral region was $1.0 \times 10^{15}$ cm$^{-3}$.

Example 3

A semiconductor device of Example 3 was manufactured in the same manner as in Example 1 except that the donor density in the peripheral region was $5.0 \times 10^{15}$ cm$^{-3}$.

Example 4

A semiconductor device of Example 4 was manufactured in the same manner as in Example 1 except that x/t was 0.8.

Example 5

A semiconductor device of Example 5 was manufactured in the same manner as in Example 1 except that x/t was 0.53.

Example 6

A semiconductor device of Example 6 was manufactured in the same manner as in Example 1 except that x/t was 0.50.

Withstand Voltage Test

For the semiconductor device of each example, a voltage was applied in a forward direction, and the voltage at the time of the dielectric breakdown was measured.

Resistivity Measurement Test

For the semiconductor device of each example, the resistivity was measured.

Results

Table 1 shows the configuration of the semiconductor device of each example and the results of the withstand voltage test and the resistivity measurement test.

TABLE 1

| | Configuration | | | | Results | |
|---|---|---|---|---|---|---|
| | Gallium oxide semiconductor layer | | Peripheral | | | |
| Example | Donor density in center region (cm$^{-3}$) | Donor density in peripheral region (cm$^{-3}$) | withstand voltage structure | x/t | Withstand voltage (V) | Resistivity (mΩcm$^2$) |
| Comparative Example 1 | $1.2 \times 10^{16}$ | $1.2 \times 10^{16}$ | Absence | — | 78 | 16.0 |
| Comparative Example 2 | $1.2 \times 10^{16}$ | $1.2 \times 10^{16}$ | GR | — | 694 | 16.0 |
| Comparative Example 3 | $1.2 \times 10^{16}$ | $1.2 \times 10^{16}$ | FLR | — | 844 | 16.0 |
| Example 1 | $1.2 \times 10^{16}$ | 0 (Semi-insulation) | FLR | 1.50 | 1579 | 16.0 |
| Example 2 | $1.2 \times 10^{16}$ | $1.0 \times 10^{15}$ | FLR | 1.50 | 1504 | 16.0 |
| Example 3 | $1.2 \times 10^{16}$ | $5.0 \times 10^{15}$ | FLR | 1.50 | 1203 | 16.0 |
| Example 4 | $1.2 \times 10^{16}$ | 0 (Semi-insulation) | FLR | 0.80 | >1500 | 16.0 |
| Example 5 | $1.2 \times 10^{16}$ | 0 (Semi-insulation) | FLR | 0.53 | >1500 | 16.1 |
| Example 6 | $1.2 \times 10^{16}$ | 0 (Semi-insulation) | FLR | 0.50 | >1500 | 16.7 |

As shown in Table 1, in Comparative Example 1 having no peripheral withstand voltage structure, the dielectric breakdown occurred in the end portion of the electrode layer at merely 78 V.

In addition, in Comparative Examples 2 and 3 having the peripheral withstand voltage structure and having no difference in the donor density between the center region and the peripheral region, the withstand voltage was higher than in Comparative Example 1 (694 V and 844 V, respectively).

In Examples 1 to 6 having the peripheral withstand voltage structure and having the donor density in the peripheral region lower than the donor density in the center region, the withstand voltage was 1200 V or higher in all Examples 1 to 6, and particularly 1500 V or higher in Examples 1, 2, and 4 to 6, the withstand voltage property was much higher than in Comparative Examples 1 to 3.

It should be noted that, in Examples 1 to 5 having x/t more than 0.5, the resistivity was 16.0 mΩcm$^2$, and the resistivity was maintained at the same level as in Comparative Example 1. On the other hand, in Example 6 having x/t of 0.5, the resistivity was 16.1 mΩcm$^2$, and an increase in the resistivity was observed.

Although not described as an example, in a case where x/t was further reduced, a much higher withstand voltage was obtained as compared with Comparative Examples 1 to 3, but a further increase in the resistivity was observed.

EXAMPLES 7 AND 8, AND COMPARATIVE EXAMPLE 4

Example 7

A semiconductor device of Example 7 was manufactured as follows.

A metal mask was formed in the center of the gallium oxide layer having the donor density of $1.2 \times 10^{16}$ cm$^{-3}$, ion implantation using a Mg ion was performed solely in a peripheral part, and subsequent annealing treatment was not performed. Thereafter, the peripheral withstand voltage structure was formed in the same manner as in Comparative Example 3.

Figure 7:
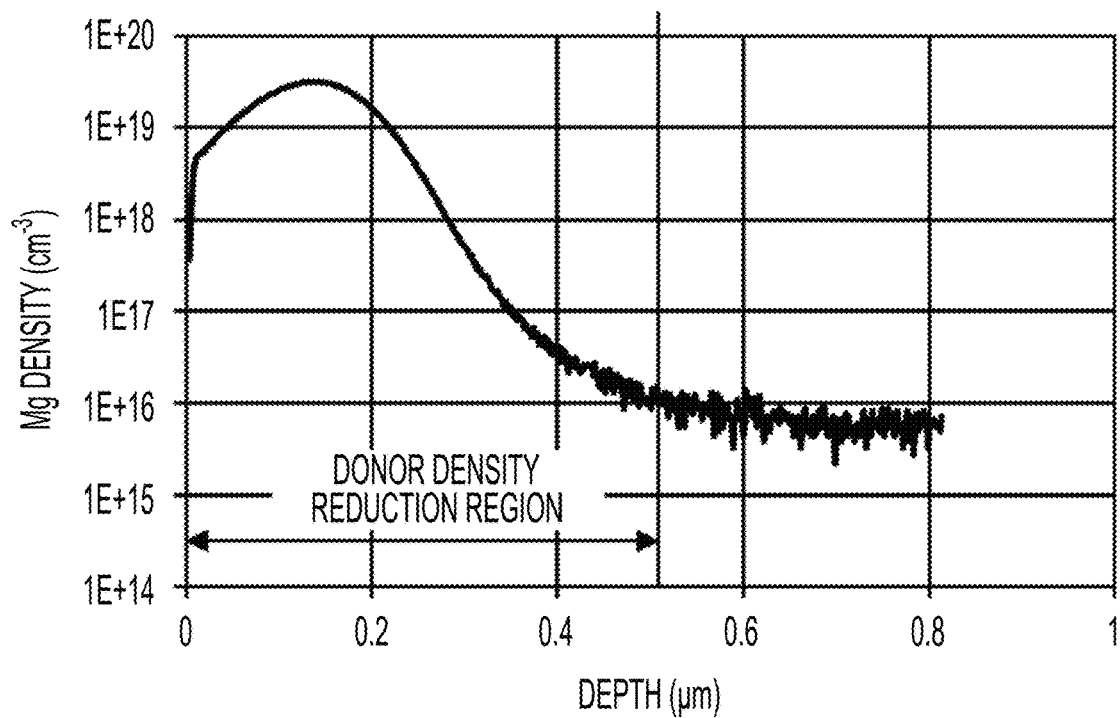
FIG. 7 is a graph showing a relationship between a depth of an n-type gallium oxide semiconductor layer and a Mg density after ion implantation in Example 7.

Here, the ion implantation was performed at 140 keV and dose $5 \times 10^{14}$ cm$^{-2}$. As a result of an ion implantation defect formed at a depth of 500 nm from the surface by the ion implantation, the donor density was reduced and semi-insulation was performed as shown in FIG. 7. As shown in FIG. 7, the depth of the region in which the donor density was reduced was 0.5 μm from the surface of the gallium oxide layer.

It should be noted that the semiconductor device of Example 7 had the same configuration as shown in FIG. 6.

In a case where the withstand voltage test was performed on the semiconductor device of Example 7, a dielectric breakdown voltage was improved and was 970 V.

Example 8

A semiconductor device of Example 8 was manufactured as follows.

Figure 8:
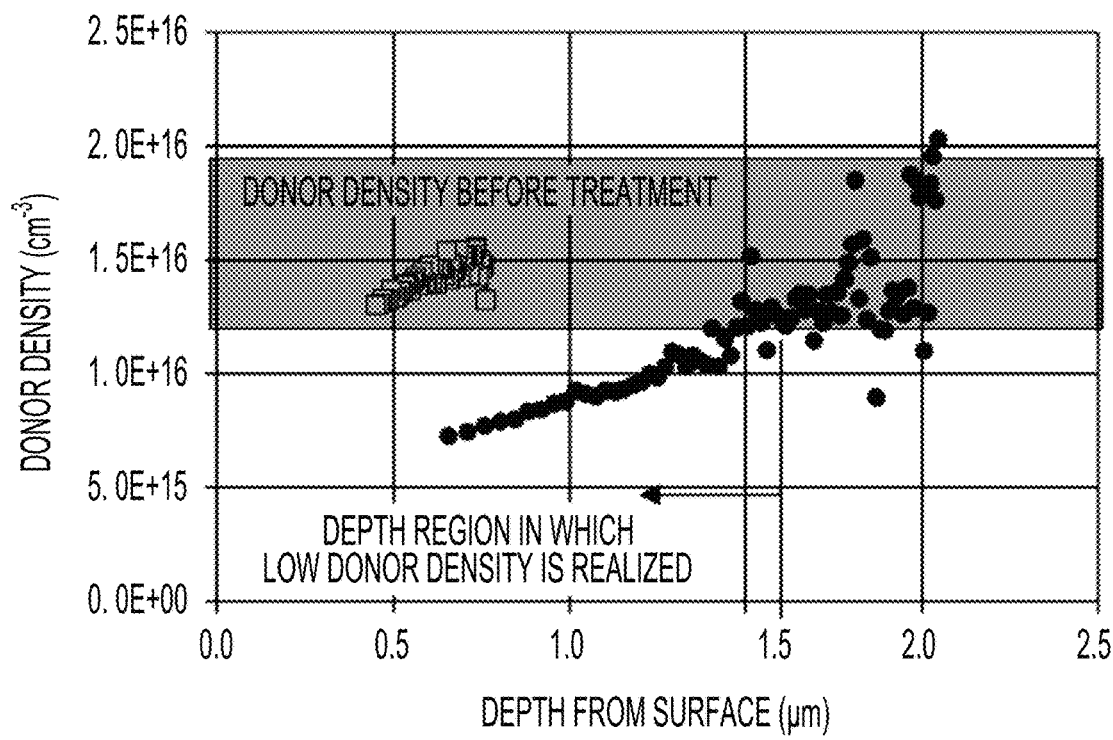
FIG. 8 is a graph showing a relationship between a depth of the n-type gallium oxide semiconductor layer and a Mg density after heat treatment in an air atmosphere in Example 8.

A metal mask was formed in the center of the gallium oxide layer having the donor density of $1.2 \times 10^{16}$ cm$^{-3}$, and the heat treatment was performed in the air atmosphere at 700° C. for 10 minutes. As a result, as shown in FIG. 8, a reduction in the donor density was observed on the surface of the gallium oxide layer. As shown in FIG. 8, the depth of the region in which the donor density was reduced was 1.5 μm to 2.0 μm.

In a case where the semiconductor device as shown in FIG. 6 was formed on the gallium oxide layer obtained described above and was subjected to the withstand voltage test, the dielectric breakdown voltage was improved and was 1070 V.

Comparative Example 4

A semiconductor device of Comparative Example 4 was manufactured as follows.

A NiO layer having the acceptor density of $1-2 \times 10^{20}$ cm$^{-3}$ was formed in the gallium oxide layer having the donor density of $1.2 \times 10^{16}$ cm$^{-3}$ to a thickness of 100 nm to obtain the pn diode.

As shown in FIG. 5, the NiO layers (second p-type nickel oxide semiconductor layer) having a width of 2.5 μm were arranged at intervals of 5.0 μm in the peripheral region 13 of the semiconductor device 2 of Comparative Example 4 to form the peripheral withstand voltage structure. Ni was formed on the NiO layer to obtain an ohmic electrode.

In the semiconductor device 2, since the donor density of the peripheral withstand voltage structure formed in the peripheral region 13 was not reduced, the dielectric breakdown occurred at 800 V as a result of the withstand voltage test.

What is claimed is:

1. A semiconductor device comprising:
   an n-type gallium oxide semiconductor layer that has a center region and a peripheral region having a lower donor density than the center region;
   an electrode layer that is laminated on the n-type gallium oxide semiconductor layer, and forms Schottky junction with the n-type gallium oxide semiconductor layer in the center region as viewed from a lamination direction; and
   a first p-type nickel oxide semiconductor layer that is laminated on the n-type gallium oxide semiconductor layer such that the first p-type nickel oxide semiconductor layer is partially positioned between the n-type gallium oxide semiconductor layer and the electrode layer, and has an outer peripheral end portion on a peripheral region side in the peripheral region as viewed from the lamination direction,
   wherein the first p-type nickel oxide semiconductor layer is positioned to straddle the center region and the peripheral region as viewed from the lamination direction.

2. The semiconductor device according to claim 1, wherein the donor density in the peripheral region is $5.0 \times 10^{15}$ cm$^{-3}$ or lower.

3. The semiconductor device according to claim 1, wherein the donor density in the center region is $1.0 \times 10^{16}$ cm$^{-3}$ or higher.

4. The semiconductor device according to claim 1, wherein, in a case where a thickness of the center region of the n-type gallium oxide semiconductor layer is denoted by t and a width of a portion of the first p-type nickel oxide semiconductor layer in the center region is denoted by x, x/t>0.50.

5. The semiconductor device according to claim 1, wherein a donor is Sn or Si.

6. The semiconductor device according to claim 1, wherein the peripheral region has the lower donor density than the center region due to being doped with an acceptor.

7. The semiconductor device according to claim 6, wherein the acceptor is N or Mg.

8. The semiconductor device according to claim 1, further comprising a plurality of second p-type nickel oxide semiconductor layers that are provided in the peripheral region of the n-type gallium oxide semiconductor layer on a side on which the first p-type nickel oxide semiconductor layer is laminated, such that the second p-type nickel oxide semiconductor layers have intervals in a direction from the center region toward the peripheral region.

9. The semiconductor device according to claim 8, wherein:
   the n-type gallium oxide semiconductor layer has a plurality of trench structures on a side on which the first p-type nickel oxide semiconductor layer and the second p-type nickel oxide semiconductor layers are laminated; and
   each of the first p-type nickel oxide semiconductor layer and the second p-type nickel oxide semiconductor layers is laminated in a recess portion of the trench structure.

10. The semiconductor device according to claim 1, wherein the semiconductor device is a pn diode, a JBS diode, a metal oxide semiconductor field effect transistor, or a junction field effect transistor.

11. A method of manufacturing the semiconductor device according to claim 1, the method comprising reducing the donor density by ion irradiation or heating in an oxygen atmosphere to form the peripheral region of the n-type gallium oxide semiconductor layer.

12. The method according to claim 11, wherein, in the ion irradiation, irradiation is performed with an ion of an acceptor element, hydrogen, or helium.

13. The method according to claim 11, wherein the n-type gallium oxide semiconductor layer is subjected to annealing treatment after the ion irradiation.

14. The method according to claim 11, wherein the n-type gallium oxide semiconductor layer is not subjected to annealing treatment after the ion irradiation.

* * * * *